(12) United States Patent
Lim et al.

(10) Patent No.: US 8,957,582 B2
(45) Date of Patent: Feb. 17, 2015

(54) ORGANIC LIGHT-EMITTING DISPLAY DEVICE AND METHOD OF MANUFACTURING THE SAME

(75) Inventors: Won-Kyu Lim, Yongin (KR);
Hyun-Chul Lee, Yongin (KR); Jae-Seok Park, Yongin (KR); Cheol-Lae Roh, Yongin (KR); Jang-Hwan Shin, Yongin (KR); Yong-Jin Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 269 days.

(21) Appl. No.: 12/929,152

(22) Filed: Jan. 4, 2011

(65) Prior Publication Data

US 2011/0163662 A1    Jul. 7, 2011

(30) Foreign Application Priority Data

Jan. 5, 2010    (KR) ........................ 10-2010-0000572

(51) Int. Cl.
*H01J 1/62*    (2006.01)
*H01J 9/26*    (2006.01)
*H01L 51/52*    (2006.01)
*H01L 27/32*    (2006.01)

(52) U.S. Cl.
CPC .......... *H01L 51/524* (2013.01); *H01L 51/5246* (2013.01); *H01L 27/3276* (2013.01); *H01L 51/525* (2013.01)
USPC .............................. 313/512; 313/506; 445/25

(58) Field of Classification Search
CPC .................................................. H01L 51/5246
USPC ............... 313/495–512; 445/24–25
See application file for complete search history.

(56) References Cited

U.S. PATENT DOCUMENTS

| 7,608,995 B2 | 10/2009 | Lee et al. | |
| 7,977,876 B2* | 7/2011 | Yamazaki et al. | 313/512 |
| 2003/0122476 A1* | 7/2003 | Wang et al. | 313/493 |
| 2003/0127976 A1* | 7/2003 | Kim et al. | 313/504 |

(Continued)

FOREIGN PATENT DOCUMENTS

| JP | 06-104465 A | 4/1994 |
| JP | 2002-31806 A | 1/2002 |

(Continued)

OTHER PUBLICATIONS

Japanese Office Action dated Jul. 29, 2014.

*Primary Examiner* — Elmito Breval
(74) *Attorney, Agent, or Firm* — Lee & Morse, P.C.

(57) ABSTRACT

An organic light-emitting display device includes a first substrate including an organic light-emitting diode and a plurality of electrodes connected to the organic light-emitting diode, the plurality of electrodes extending on the first substrate along a first direction toward an edge of the first substrate, a second substrate connected to the first substrate, the second substrate being shorter than the first substrate and exposing a portion of the plurality of electrodes on the first substrate, a sealing material disposed between the first substrate and the second substrate to surround the organic light-emitting diode, and an electrode protecting layer partially covering the exposed portion of the plurality of electrodes on the first substrate, a first side of the electrode protecting layer being between the first substrate and the second substrate, and a second side of the electrode protecting layer protruding beyond the second substrate.

17 Claims, 7 Drawing Sheets

(56) References Cited

U.S. PATENT DOCUMENTS

| | | |
|---|---|---|
| 2003/0143423 A1 | 7/2003 | McCormick et al. |
| 2004/0150319 A1 | 8/2004 | Tomimatsu et al. |
| 2006/0105544 A1 | 5/2006 | Takanashi et al. |
| 2006/0284556 A1* | 12/2006 | Tremel et al. ............ 313/512 |
| 2007/0170605 A1* | 7/2007 | Lee et al. ................. 264/1.1 |
| 2007/0170839 A1 | 7/2007 | Choi et al. |
| 2007/0170845 A1* | 7/2007 | Choi et al. ............... 313/504 |
| 2007/0171637 A1* | 7/2007 | Choi ........................ 362/227 |
| 2007/0172971 A1* | 7/2007 | Boroson ..................... 438/26 |
| 2008/0030128 A1* | 2/2008 | Kim ........................ 313/504 |
| 2008/0102546 A1 | 5/2008 | Ryu et al. |
| 2010/0258346 A1* | 10/2010 | Chen et al. ............... 174/521 |

FOREIGN PATENT DOCUMENTS

| | | |
|---|---|---|
| JP | 2003-228302 A | 8/2003 |
| JP | 2005-516369 A | 6/2005 |
| JP | 2007-062074 A | 3/2007 |
| JP | 2007-194184 A | 8/2007 |
| JP | 2008-123983 A | 5/2008 |
| KR | 10 2006-0052590 A | 5/2006 |
| KR | 10 2006-0101189 A | 9/2006 |
| KR | 10 2008-0037848 A | 5/2008 |

* cited by examiner

ORGANIC LIGHT-EMITTING DISPLAY DEVICE AND METHOD OF MANUFACTURING THE SAME

BACKGROUND

1. Field

Example embodiments relate to an organic light-emitting display device and a method of manufacturing the same. More particularly, example embodiments relate to an organic light-emitting display device with an electrode protecting layer for protecting electrodes and a method of manufacturing the same, thereby effectively absorbing energy and vibrations caused by cutting of a substrate.

2. Description of the Related Art

Recently, display devices using an organic light-emitting diode, e.g., active matrix organic light-emitting display devices, have been drawing attention among various types of display devices, as semiconductor technology has been rapidly developing. For example, the active matrix organic light-emitting display devices may include pixels, i.e., basic units of an image expression, on a substrate in a matrix form that are independently controlled by arranging a thin film transistor (TFT) for each pixel.

Typically, a conventional organic light-emitting display device may include a TFT, an organic light-emitting diode, and a wiring pattern on a substrate, and an encapsulation substrate may seal the substrate. The organic light-emitting diode may be electrically connected to an external device via a connecting device or a flexible printed circuit board (FPCB).

SUMMARY

Embodiments are directed to an organic light-emitting display device and a method of manufacturing the same, which substantially overcome one or more of the problems due to the limitations and disadvantages of the related art.

It is therefore a feature of an embodiment to provide an organic light-emitting display device configured to effectively protect electrodes during removal of a portion of a substrate.

It is therefore another feature of an embodiment to provide an organic light-emitting display device with an electrode protecting layer configured to protect electrodes against laser damage while removing some portion of a substrate with the laser.

It is yet another feature of an embodiment to provide an organic light-emitting display device with a first substrate and a second substrate shorter than the first substrate, and an electrode protecting layer extending between the first and second substrates from a pixel region to a non-pixel region on a first substrate.

It is still another feature of an embodiment to provide a method of manufacturing an organic light-emitting display device having one or more of the above features.

At least one of the above and other features and advantages may be realized by providing an organic light-emitting display device, including a first substrate including an organic light-emitting diode and a plurality of electrodes connected to the organic light-emitting diode, the plurality of electrodes extending on the first substrate along a first direction toward an edge of the first substrate, a second substrate connected to the first substrate, the second substrate being shorter than the first substrate and exposing a portion of the plurality of electrodes on the first substrate, a sealing material disposed between the first substrate and the second substrate to surround the organic light-emitting diode, and an electrode protecting layer partially covering the exposed portion of the plurality of electrodes on the first substrate, a first surface of the electrode protecting layer being between the first substrate and the second substrate, and a second surface of the electrode protecting layer protruding beyond the second substrate.

The electrode protecting layer may contact a periphery on one side of the sealing member and may be disposed to extend in a crosswise direction of the electrodes.

The sealing material may include a frit glass and the electrode protecting layer may include the same material as the sealing member.

The electrode protecting layer may be disposed between the first substrate and the second substrate, corresponding to each of the electrodes, and may be formed to extend for a predetermined distance toward an outer side of the terminal portion of the second substrate in a direction of the extending electrodes to partially cover each of the electrodes.

The organic light-emitting display device may further include an outside sealing member which surrounds the sealing material and is disposed at an outer side of the first substrate and the second substrate.

The organic light-emitting display device may further include a plurality of banks which are spaced apart from each other along the outer edge of the sealing material between the first substrate and the second substrate and guide a flow of the outside sealing material before the outside sealing material is hardened.

A height of the banks may correspond to a gap between the first substrate and the second substrate.

A portion of the electrode protecting layer including the first surface of the electrode protecting layer may overlap portions the first and second substrates along an edge of the second substrate.

A height of the electrode protecting layer may substantially equal a distance between the first and second substrates.

The electrode protecting layer may be a continuous layer along a second direction perpendicular to the first direction.

The electrode protecting layer may overlaps all the electrodes connected to the organic light-emitting diode.

At least one of the above and other features and advantages may also be realized by providing a method of manufacturing an organic light-emitting display device, including forming a first substrate with an organic light-emitting diode and a plurality of electrodes connected to the organic light-emitting diode, the plurality of electrodes extending on the first substrate along a first direction toward an edge of the first substrate, bonding the first substrate to a second substrate with a sealing material therebetween, the sealing material surrounding the organic light-emitting diode, forming an electrode protecting layer between the first and second substrates to partially cover the electrodes on the first substrate, and removing a portion of the second substrate, such that the second substrate is shorter than the first substrate and exposes a portion of the plurality of electrodes on the first substrate, and such that a first surface of the electrode protecting layer is between the first substrate and the second substrate and a second surface of the electrode protecting layer protrudes beyond the second substrate.

The sealing material may include a frit glass, the electrode protecting layer may include the same material as the sealing material. The formation of the electrode protecting layer on the first substrate may be performed with the application of the sealing material, and one side of the electrode protecting layer may contact one side edge of the sealing material and the other side of the electrode protecting layer may be disposed at outer side of a position of a scribe line where the second substrate is scribed. The method may further include filling an outside sealing material between the first substrate and the second substrate to surround an outer side of the sealing material after the bonding of the first substrate and the second substrate. The preparation of the first substrate may include forming a plurality of banks spaced apart from each other along an outer edge where the sealing material is to be disposed on the first substrate. The electrode protecting layer may include the same material as the banks, and the formation of the electrode protecting layer on the first substrate may be performed with the forming of the banks, and the electrode protecting layer may be formed in a number corresponding to the number of electrodes. The electrode protecting layer may extend for a predetermined distance in a direction of the extending electrodes to partially cover each of the electrodes, and the outside sealing material may be injected between the first substrate and the second substrate to fill spaces between the banks and between the electrode protecting layers.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
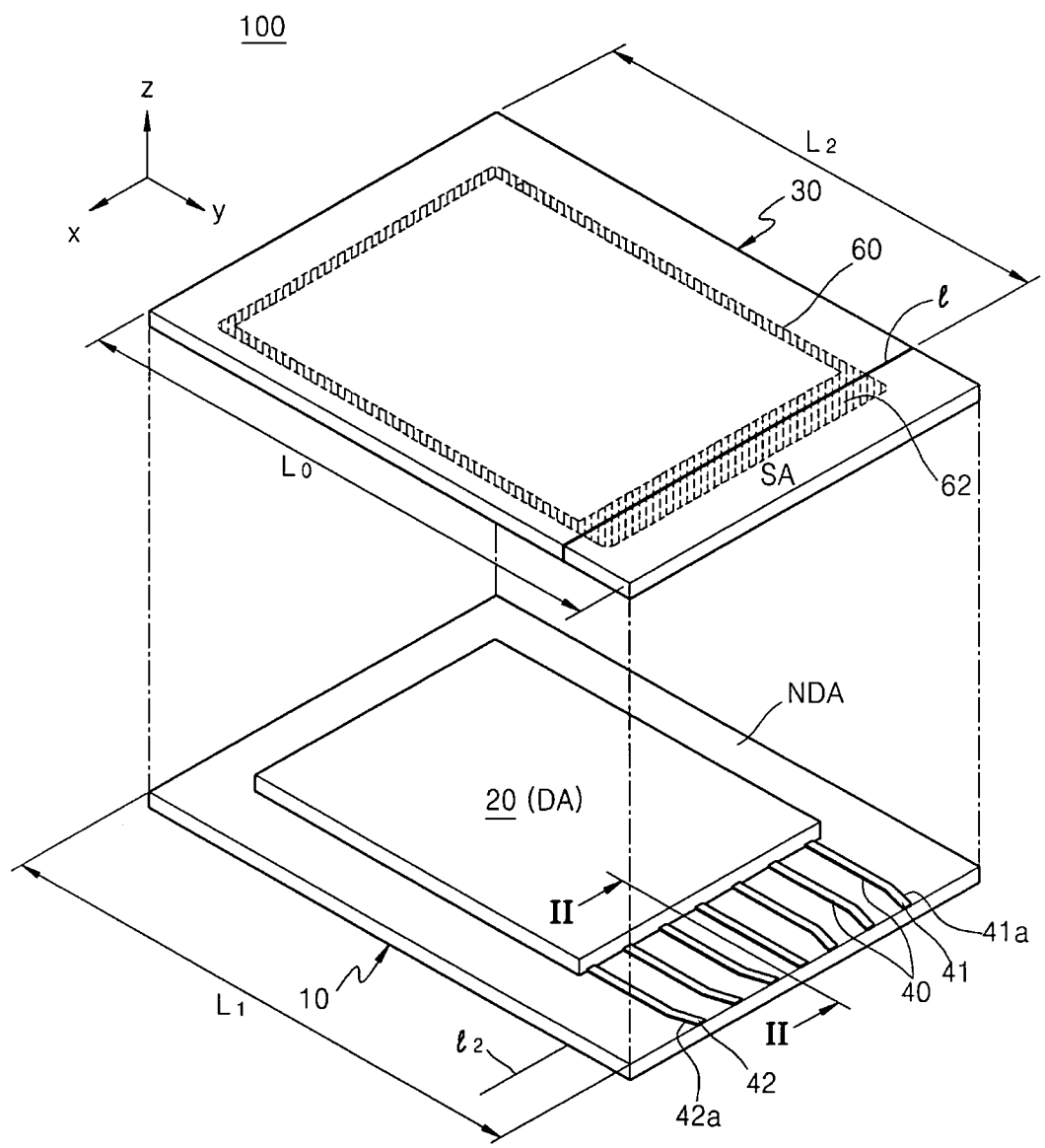
FIG. 1 illustrates an exploded perspective view of a process of bonding a first substrate and a second substrate of an organic light-emitting display device according to an embodiment.

Korean Patent Application No. 10-2010-0000572, filed on Jan. 5, 2010, in the Korean Intellectual Property Office, and entitled: "Organic Light-Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when a layer or element is referred to as being "on" another element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

Hereinafter, the structure and function of an organic light-emitting display device according to example embodiments will be described in detail with reference to FIGS. 1-2. FIG. 1 illustrates a schematic, exploded perspective view of an organic light-emitting display device according to an embodiment, and FIG. 2 illustrates a partial, assembled cross-sectional view of FIG. 1.

Figure 2:
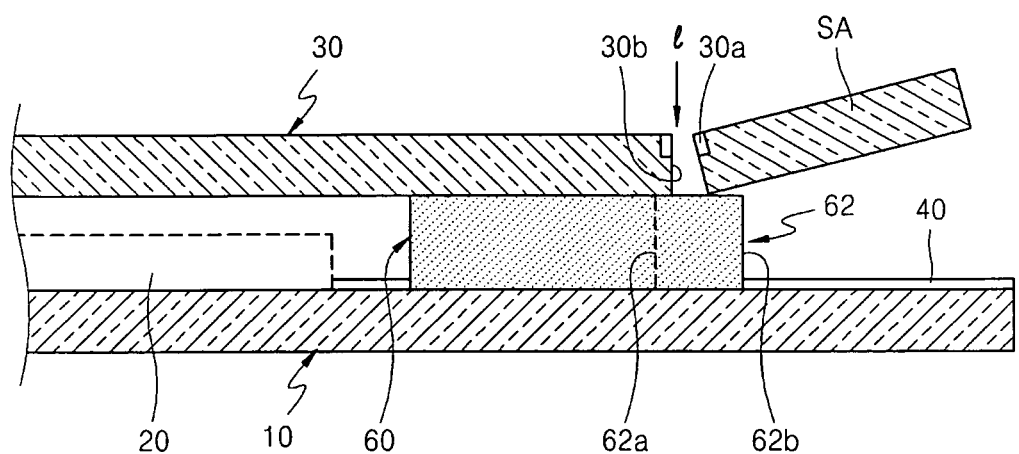
FIG. 2 illustrates a cross-sectional view of a process of cutting the second substrate after assembly of the first substrate and the second substrate in FIG. 1.

Referring to FIGS. 1-2, an organic light-emitting display device 100 according to the present embodiment may include a first substrate 10, an organic light-emitting diode 20 disposed on the first substrate 10, a plurality of electrodes 40 disposed on the first substrate 10, a second substrate 30 connected to the first substrate 10, and a sealing material 60 which is disposed between the first substrate 10 and the second substrate 30 and surrounds the organic light-emitting diode 20. The organic light-emitting display device 100 may further include an electrode protecting layer 62 which is disposed between the first substrate 10 and the second substrate 30 to maintain a gap therebetween and to protect the electrodes 40.

The first substrate 10 may be formed of an insulating material or a metallic material. Glass or plastic may be used as the insulating material, and stainless steel, e.g., stainless using steel (SUS) described in Japanese industrial standard, may be used as the metallic material. The first substrate 10 may include a light-emitting area (DA) for emitting light and a non-light-emitting area (NDA) disposed at the periphery of the light-emitting area (DA). On one side, i.e., surface, of the first substrate 10, the organic light-emitting diode 20 and the plurality of electrodes 40 may be disposed to face the second substrate 30. For example, when the organic light-emitting display device 100 is manufactured in an active matrix (AM) form, the organic light-emitting diode 20, which includes an organic light-emitting layer (not shown), a TFT (not shown) for driving the organic light-emitting diode 20, wires (not shown) electrically connected thereto, etc., may be formed in, e.g., may define, the light-emitting area (DA). At one side of the non-light-emitting area (NDA), the plurality of electrodes 40, which are connected to interconnections of the light-emitting area (DA) and extend outside the light-emitting area (DA), may be disposed. That is, the plurality of electrodes 40 may extend on the first substrate 10 from the organic light-emitting diode 20 toward an outermost edge of the first substrate 10 along the non-light-emitting area (NDA).

After the organic light-emitting diode 20 and the plurality of electrodes 40 are disposed on the first substrate 10, the second substrate 30 may be arranged to face and overlap the first substrate 10. The first substrate 10 and the second substrate 30 may be bonded to each other with the sealing material 60 disposed along an edge of the organic light-emitting diode 20. That is, the second substrate 30 may seal up the organic light-emitting diode 20, which is disposed on the first substrate 10. In other words, as illustrated in FIG. 2, the organic light-emitting diode 20 may be sealed in a sealed area between the first and second substrates 10 and 30 by applying the sealing material 60 between the first and second substrates 10 and 30 along edges of the organic light-emitting diode 20. As further illustrated in FIG. 2, the plurality of electrodes 40 may extend from the organic light-emitting diode 20 to an exterior of the sealed area. For example, the second substrate 30 may include a transparent glass, and the sealing material 60 may include frit glass. As illustrated in FIG. 1, the first substrate 10 may have a first length $L_1$, and the second substrate 30 may have an original length $L_0$.

As further illustrated in FIG. 2, the second substrate 30 may be cut, i.e., after the first substrate 10 and the second substrate 30 are bonded, to remove a cutting area (SA) from the second substrate 30. In other words, the original length $L_0$ of the second substrate 30 may be shortened by a length of the cutting area (SA) to form a shortened second substrate 30 having a second length $L_2$ ($L_2 < L_0$). The cutting area (SA) may be cut along a scribe line l after the bonding of the first substrate 10 and the second substrate 30, such that a terminal portion 30b of the second substrate 30, i.e., an outermost edge of the shortened second substrate 30, and the plurality of electrodes 40 in the non light-emitting area (NDA) may be exposed. It is noted that a straight line $l_2$ indicated on the first substrate 10 in FIG. 1 corresponds to the scribe line l of the second substrate 30, so the cutting process of the second substrate 30 is performed at a position corresponding to the straight line $l_2$ and the scribe line l after the bonding of the first substrate 10 and the second substrate 30.

In detail, as illustrated in FIG. 2, when the second substrate 30 is initially bonded, e.g., directly bonded, to the first substrate 10, the electrodes 40 of the first substrate 10 may not be externally exposed, i.e., the electrodes 40 in the non-light-emitting area (NDA) may be covered by the second substrate 30. As further illustrated in FIG. 2, after the bonding of the first substrate 10 and the second substrate 30 with the sealing material 60, the cutting area (SA) may be removed by performing a cutting process along the scribe line l of the second substrate 30, and the electrodes 40 in the non-light-emitting area (NDA) may be exposed. That is, in the completed organic light-emitting display device 100, the length of the first substrate 10 in a longitudinal direction is the first length $L_1$, while the final length, i.e., a shortened length, of the second substrate 30 in the longitudinal direction is the second length $L_2$. Because the second length $L_2$ of the second substrate 30 is formed shorter than the first length $L_1$ of the first substrate 10, the electrodes 40 of the first substrate 10 may be externally exposed. The electrodes 40 on the first substrate 10 may be externally exposed by the cutting process, and may be electrically connected to a driver integrated circuit or a flexible printed circuit (FPC), etc. by a subsequent process, thereby connecting an external device to the organic light-emitting display device 100.

The cutting process of removing the cutting area (SA) of the second substrate 30 may include a diamond wheel or a laser, e.g., a short pulse laser. Because the short pulse laser may add high pulse energy, e.g., instantaneously, to an object to be processed, thermal damage to the object to be processed may be minimized. For example, the second substrate 30 may be scribed with a short pulse laser to form a groove 30a along the scribe line l, so the cutting area (SA) may be removed by using a cutting system along the groove 30a, e.g., a depth of the groove 30a must be maximized in order to minimize mechanical damage. However, in a conventional organic light-emitting display device, e.g., a device without the electrode protecting layer 62, the electrodes may be damaged as the energy of the laser is transferred to the electrodes via the substrate during formation of the groove.

In the organic light-emitting display device 100 according to example embodiments, however, the electrode protecting layer 62 may be disposed to protect the electrodes 40 between the first substrate 10 and the second substrate 30. Therefore, damage to the electrodes 40 may be prevented or substantially minimized during use of the cutting process, e.g., during formation of the groove 30a by the short pulse laser. The electrode protecting layer 62 may be disposed on, e.g., directly on, the first substrate 10 to cover the electrodes 40. For example, the electrode protecting layer 62 may be formed of frit glass. For example, the electrode protecting layer 62 may extend as a continuous layer, e.g., along the x-axis, to cover all the plurality of electrodes 40. That is, a length of the electrode protecting layer 62 along its longitudinal direction, i.e., along the x-axis, may be sufficient to cover all the plurality of electrodes 40, e.g., may equal at least a distance between an outermost edge 41a of a first electrode 41 to an outermost edge 42a of a last electrode 42. For example, the electrode protecting layer 62 may extend between the scribe and straight lines l and $l_2$ of the second and first substrates 30 and 10, and may have a height, i.e., a distance along the z-axis, that substantially equals a distance between the assembled first and second substrates 10 and 30. Therefore, the electrode protecting layer 62 may protect the electrodes 40, as well as maintain a gap between the first substrate 10 and the second substrate 30. Further, since the plurality of electrodes 40 extends along the y-axis, and the electrode protecting layer 62 extends along the x-axis, i.e., the electrode protecting layer 62 extends in a crosswise direction of the plurality of electrodes 40, the energy and vibrations which are transferred through the second substrate 30 during the cutting process along the scribe line l may be effectively absorbed in the electrode protecting layer 62. As such, the energy and vibrations generated during the cutting process may not reach the electrodes 40, thereby preventing or substantially minimizing damage thereto.

The sealing material 60 may include frit glass, which has a lower melting point than the first substrate 10 and the second substrate 30. The sealing material 60 may prevent oxygen or moisture from permeating into the sealed space of the organic light-emitting diode 20 between the first and second substrates 10 and 30. The sealing material 60 and the electrode protecting layer 62 may be formed of the same material, and may be formed simultaneously, i.e., a process of applying the sealing material 60 may be performed simultaneously with a process of applying a material to form the electrode protecting layer 62. For example, the sealing material 60 and the electrode protecting layer 62 may be in direct contact with each other, e.g., along an entire length of the electrode protecting layer 62, and may be integral with each other. A first surface 62a of the electrode protecting layer 62 may be disposed between the first substrate 10 and the second substrate 30, e.g., in direct contact with the sealing material 60, and a second surface 62b of the electrode protecting layer 62, i.e., a surface opposite the first surface 62a, may protrude to an outer side of the terminal portion 30b of the second substrate 30 after removal of the cutting area (SA) of the second substrate 30. For example, the electrode protecting layer 62 may be external to the sealed space defined by the sealing material 60, so the electrode protecting layer 62 may be at an outer side relative to the terminal portion 30b of the second substrate 30, as compared to the sealing material 60.

Although not illustrated in the drawings, the organic light-emitting display device 100 may further include an outside sealing material along an external edge of the sealing material 60 between the first substrate 10 and the second substrate 30. For example, the outside sealing material may surround, e.g., completely surround, the sealing material 60, and may be disposed between the sealing material 60 and the electrode protecting layer 62. The outside sealing material may serve as a reinforcing material to more tightly bond the first substrate 10 and the second substrate 30. Furthermore, banks (not shown) may be formed along an external edge of the sealing member 60 between the first substrate 10 and the second substrate 30 in order to guide the flow of the outside sealing material when the outside sealing material is filled between the first substrate 10 and the second substrate 30.

A method of manufacturing the organic light-emitting display device 100 may include forming the organic light-emitting diode 20 and the electrodes 40 on the first substrate, and preparing the second substrate 30 to correspond to, e.g., to overlap, the first substrate 10. Next, the method may include forming the electrode protecting layer 62 on the second substrate 30 to partially cover, e.g., overlap, the electrodes 40 on the first substrate 10 and to maintain the gap between the first substrate 10 and the second substrate 30, applying the sealing material 60 to the second substrate 30, and bonding the first substrate 10 and the second substrate 30 with the electrode protecting layer 62 and the sealing material 60 therebetween. Next, a portion of the second substrate 30 may be removed along the scribe line l, i.e., a line corresponding to, e.g., overlapping, a position where the electrode protecting layer 62 is disposed. Since the groove 30a is formed along the scribe line l, which overlaps the electrode protecting layer 62, the groove 30a is formed above the electrode protecting layer 62. As such, the electrode protecting layer 62 may prevent or substantially minimize any energy or vibration transfer to the electrodes 40 during formation of the groove 30a.

Figure 3:
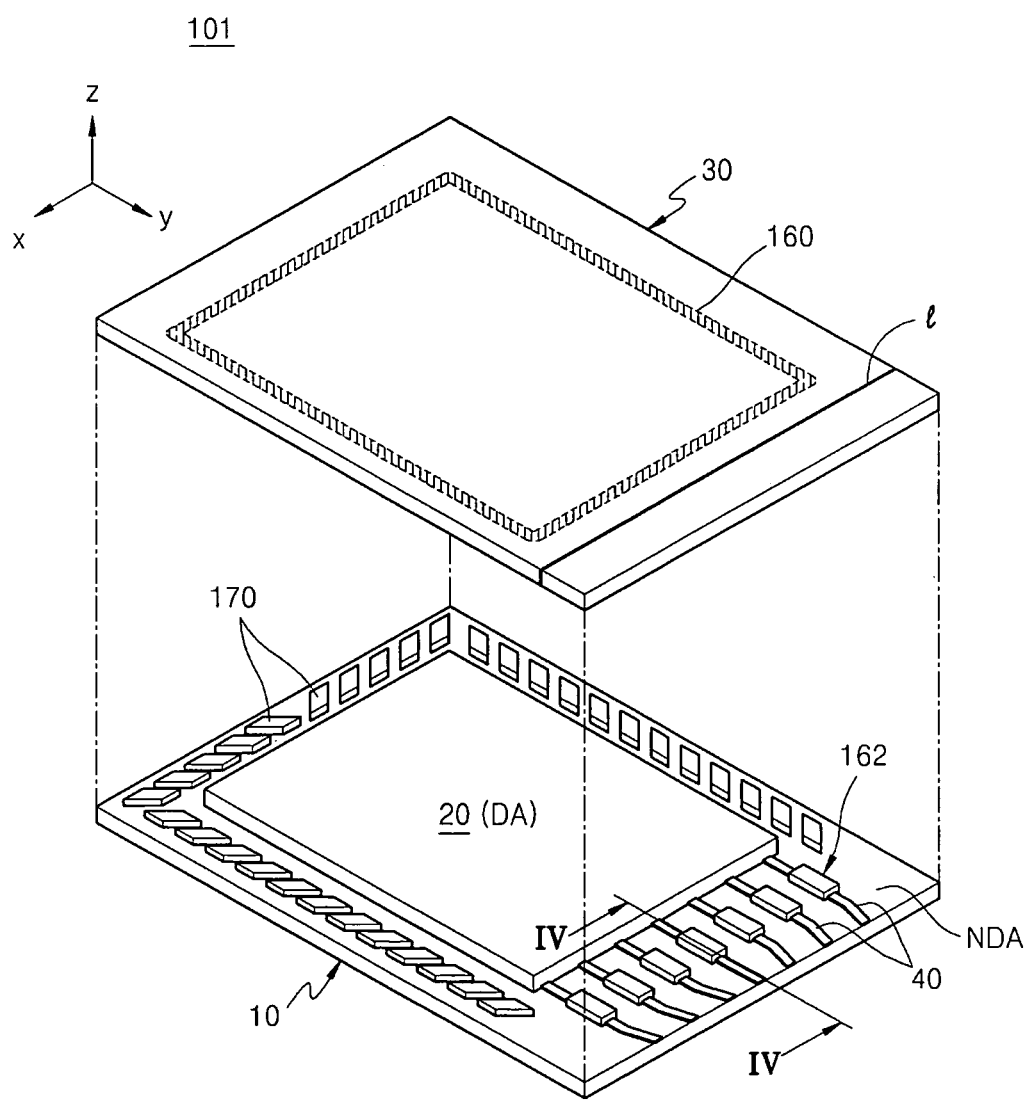
FIG. 3 illustrates an exploded perspective view of a process of bonding a first substrate and a second substrate of an organic light-emitting display device according to another embodiment.
Figure 4:
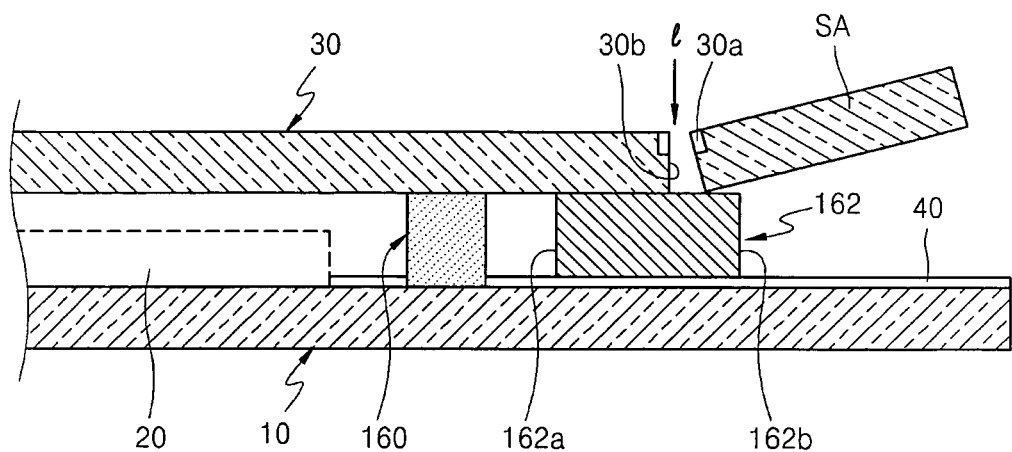
FIG. 4 illustrates a cross-sectional view of a process of cutting the second substrate after assembling the first substrate and the second substrate in FIG. 3.
Figure 5:
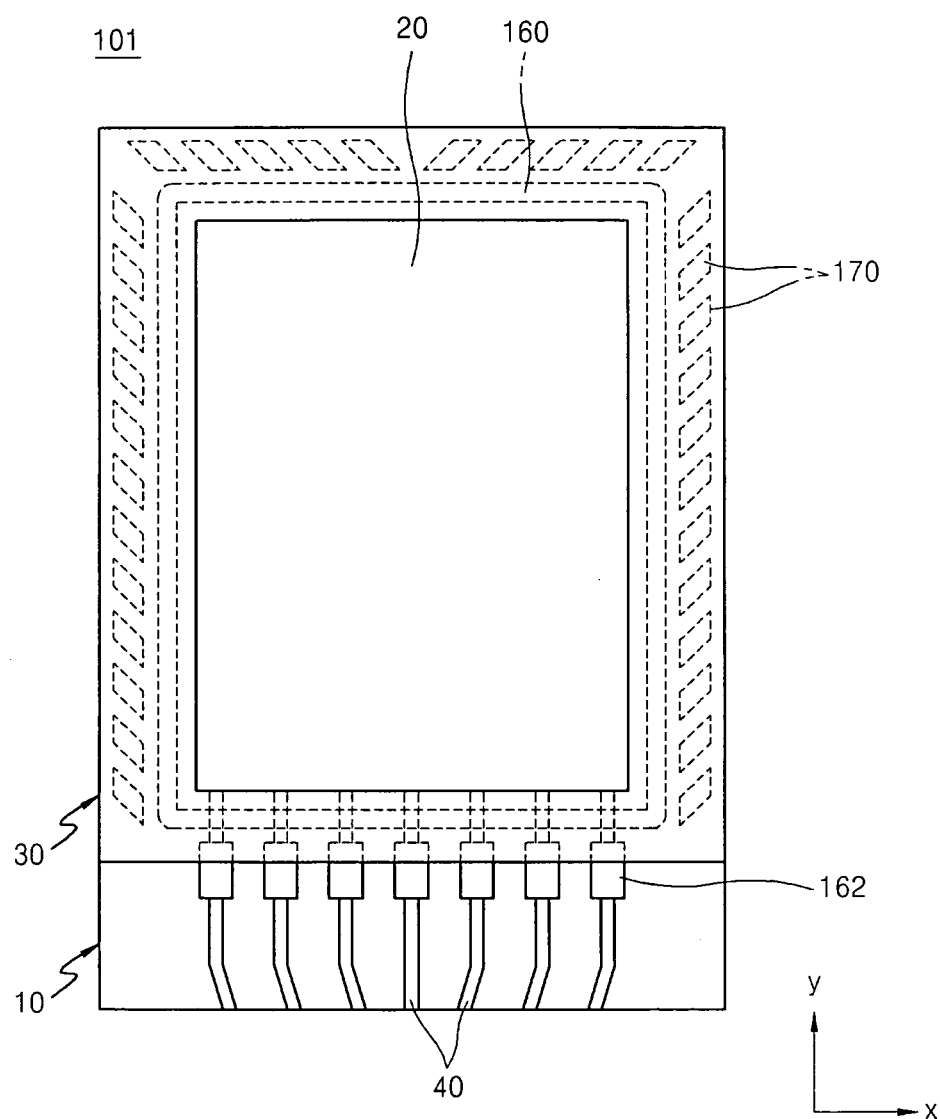
FIG. 5 illustrates a plan view of the organic light-emitting display device in FIG. 4.
Figure 6:
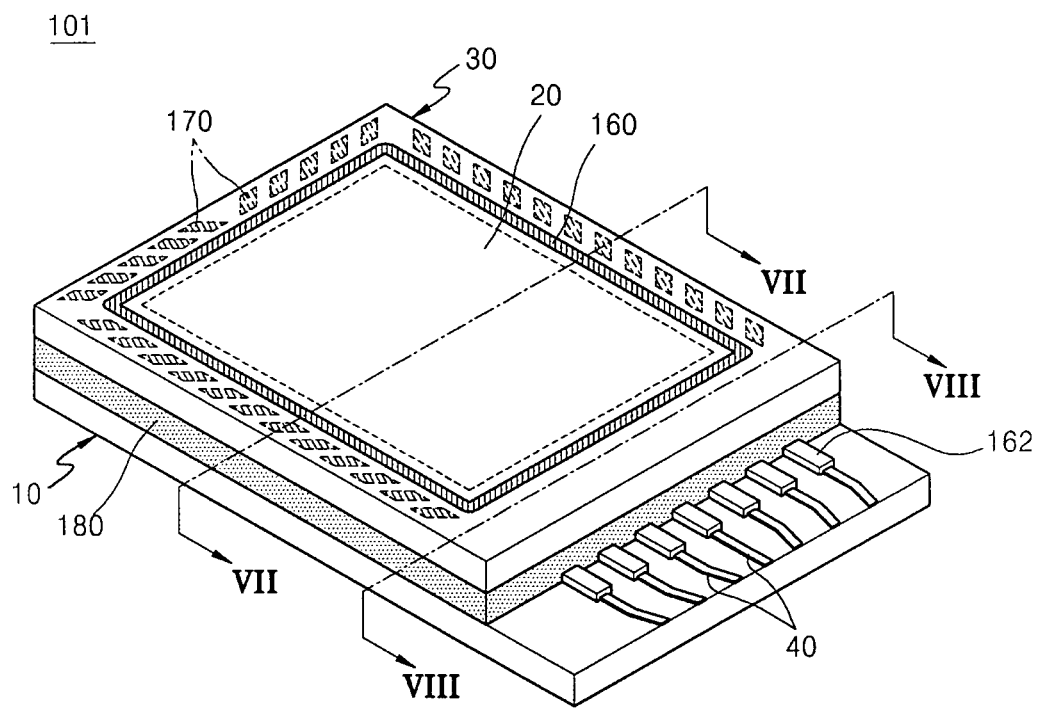
FIG. 6 illustrates a perspective view of a process of injecting a second sealing material into the organic light-emitting display device after cutting the second substrate in FIG. 4.
Figure 7:
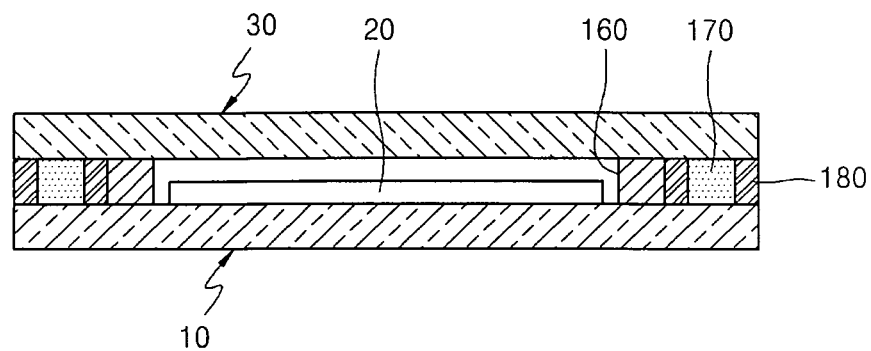
FIG. 7 illustrates a cross-sectional view along line VII-VII in FIG. 6.
Figure 8:
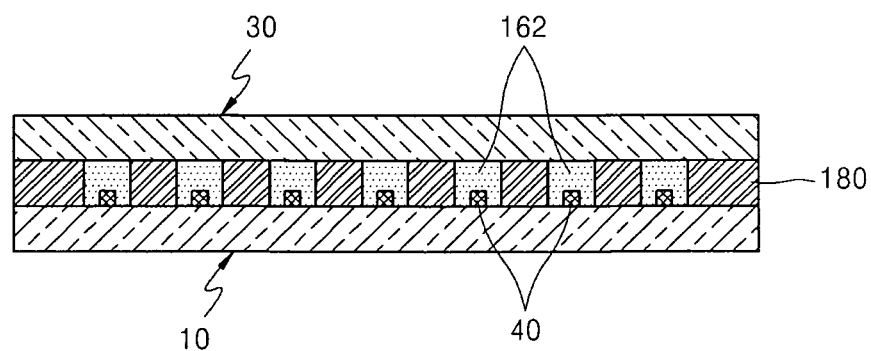
FIG. 8 illustrates a cross-sectional view along line VIII-VIII in FIG. 6.

Another embodiment of an organic light-emitting display device will be described in detail with reference to FIGS. 3-8. FIG. 3 illustrates an exploded perspective view of a process of bonding the first substrate 10 and the second substrate 30 of an organic light-emitting display device 101 according to another embodiment, FIG. 4 illustrates a cross-sectional view of a process of cutting the second substrate 30 after assembling the first substrate 10 and the second substrate 30 in FIG. 3, and FIG. 5 illustrates a plan view of the organic light-emitting display device 101 after cutting the second substrate 30. FIGS. 6-8 illustrate a process of injecting a second sealing material.

Referring to FIGS. 3-4, the organic light-emitting display device 101 may include the first substrate 10 on which the organic light-emitting diode 20 and the electrodes 40 are disposed on one side, the second substrate 30 which binds to the first substrate 10, and a sealing material 160 which is disposed between the first substrate 10 and the second substrate 30 and surrounds the organic light-emitting diode 20. The organic light-emitting display device 101 may further include an electrode protecting layer 162 which is disposed between the first substrate 10 and the second substrate 30 to maintain the gap therebetween and protect the electrodes 40.

The first substrate 10 may include the light-emitting area (DA) for emitting light and the non-light-emitting area (NDA) disposed at the periphery of the light-emitting area (DA). On the side of the first substrate 10, the organic light-emitting diode 20 and the electrodes 40 may be disposed in the light-emitting area (DA). After the second substrate 30 is arranged to face the first substrate 10, the first substrate 10 and the second substrate 30 may be bonded to each other with the sealing material 160 disposed along the edge of the organic light-emitting diode 20. The sealing material 160 may include frit glass. Because the sealing material 160 is disposed to surround the organic light-emitting diode 20, a terminal portion of one side thereof may be disposed at an inner region of the scribe line l of the second substrate 30. A process of removing the cutting area (SA) may be performed by cutting a portion of the second substrate 30 along the scribe line l after the bonding of the first substrate 10 and the second substrate 30. Also, as illustrated in FIG. 3, the electrode protecting layer 162 may be formed in order to absorb energy and mechanical shock which are transferred to the electrodes 40 by the cutting process of the second substrate 30.

As illustrated in FIG. 3, a shape of the electrode protecting layer 162 may be different from the electrode protecting layer 62 in FIG. 1. In detail, the electrode protecting layer 162 may be formed in a number corresponding to a number of the electrodes 40. That is, the electrode protecting layer 162 may include a plurality of discrete segments spaced apart from each other, so each discrete segment may be formed on a respective electrode 40. The electrode protecting layer 162 may be formed on, e.g., directly on, the first substrate 10 to extend to a predetermined length along the y-axis, i.e., along a longitudinal direction of the electrodes 40, from a region corresponding to an inner region of the second substrate 30 relative to the scribe line l to a region corresponding to an outer region of the second substrate 30 relative to the scribe line l. That is, the electrode protecting layer 162 may extend beyond the outer side of the terminal portion 30b of the second substrate 30 in order to partially cover each of the electrodes 40. Thus, a first surface 162a of the electrode protecting layer 162 may be disposed between the first substrate 10 and the second substrate 30 after the cutting process, i.e., in a region corresponding to an inner region of the second substrate 30 relative to the scribe line l, and a second surface 162b may protrude to the outer side of the terminal portion 30b of the second substrate 30 after the cutting process, i.e., a region corresponding to an outer region of the second substrate 30 relative to the scribe line l, to have at least a portion thereof exposed. In other words, a first portion of the electrode protecting layer 162 that includes the first surface 162a may overlap both the first and second substrates 10 and 30, i.e., the first surface 162a may overlap both the first and second substrates 10 and 30, and a second portion of the electrode protecting layer 162 that includes the second surface 162b may extend on the first substrate 10 beyond the second substrate 30, i.e., the second surface 162b may not overlap the second substrate 30 after cutting.

As further illustrated in FIG. 5, the organic light-emitting display device 101 may further have a plurality of banks 170 disposed to be spaced apart from each other along an outer edge of the sealing material 160 between the first substrate 10 and the second substrate 30. Further, an outside sealing material 180 (FIGS. 6-8) may be disposed to fill spaces between adjacent banks 170 and between adjacent segments of the electrode protecting layers 162.

The banks 170 may guide the outside sealing material 180 to flow smoothly between the first substrate 10 and the second substrate 30 through the segments of the electrode protecting layer 162. Thus, the banks 170 may improve the filling properties of the outside sealing material 180. Furthermore, the banks 170 may maintain a gap between the first substrate 10 and the second substrate 30, along with the electrode protecting layer 162. Thus, a height of the banks 170 may correspond to the gap between the first substrate 10 and the second substrate 30, which is maintained by the electrode protecting layer 162.

Formation of the electrode protecting layer 162 may be performed with formation of the banks 170, i.e., simultaneously. The electrode protecting layer 162 may be formed of the same material as the banks 170. In other words, the banks 170 and the electrode protecting layer 162, during a process of forming the organic light-emitting diode 20 on the first substrate 10, may be formed with no additional process, e.g., by using a material such as a photoresist for a photolithography process when an insulating layer, e.g., a pixel defining layer, is formed.

Injection of the outside sealing material 180 will be described hereinafter in detail with reference to FIGS. 6-8. FIG. 6 illustrates a perspective view of the organic light-emitting display device 101 in FIG. 5 with a second sealing material after cutting the second substrate 30, FIG. 7 illustrates a cross-sectional view along line VII-VII in FIG. 6, and FIG. 8 illustrates a cross-sectional view along line VIII-VIII in FIG. 6.

After the electrode protecting layer 162 and the banks 170 are formed on the first substrate 10, the sealing material 160 may be applied to the second substrate 30, followed by bonding of the first substrate 10 and the second substrate 30. After bonding the first substrate 10 and the second substrate 30, the cutting area (SA) of the second substrate 30 may be removed along the scribe line l of the second substrate 30. After the cutting process of the second substrate 30, a process of injecting the outside sealing material 180 may be performed along the periphery of the first substrate 10 and the second substrate 30. The outside sealing member 180 may include a resin material, e.g., at least one of an epoxy, an acryl, and a urethane. The outside sealing material 180 may serve as a reinforcing material to more tightly bond the first substrate 10 and the second substrate 30.

A method of manufacturing the organic light-emitting display device 101 may include preparing the first substrate 10 on which the organic light-emitting diode 20 and electrodes 40 are formed, preparing the second substrate 30 corresponding to the first substrate 10, forming the electrode protecting layer 162 on the electrodes 40 in order to partially cover each of the electrodes 40 on the first substrate 10, and forming the plurality of banks 170 between the first substrate 10 and the second substrate 30 to be spaced apart along the outer edge of the sealing material 160 to be formed. Next, the method may include applying the sealing material 160 to the second substrate 30, bonding the first substrate 10 and the second substrate 20, and removing a portion of the second substrate 30 along the scribe line l which corresponds to a position where the electrode protecting layer 162 is disposed.

Next, as illustrated in FIGS. 6-8, the outside sealing material 180 may be filled between the first substrate 10 and the second substrate 30 to surround the outside of the sealing material 160 after the bonding of the first substrate 10 and the second substrate 30. According to the organic light-emitting display device 101 and a method of manufacturing the same described above, the electrode protecting layer 162, which is extending on the electrodes 40 in order to cover each of the electrodes 40, may effectively protect the electrodes 40 by absorbing energy and shock which are transferred during the cutting process of the second substrate 30.

An organic light-emitting display device according to example embodiments may include disposing an electrode protecting layer between a first substrate and a second substrate in order to cover electrodes of the first substrate. The electrode protecting layer may protect the electrodes against damage because the electrode protecting layer absorbs energy and shock which are transferred during a cutting process of the second substrate in order to expose the electrodes. Furthermore, a high-quality organic light-emitting display device may be manufactured because the gap between the first substrate and the second substrate may be uniformly maintained during the cutting process of the second substrate or during the process of filling the outside sealing material.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting display device, comprising:
a first substrate including an organic light-emitting diode and a plurality of electrodes connected to the organic light-emitting diode, the plurality of electrodes extending on the first substrate along a first direction toward an edge of the first substrate;
a second substrate connected to the first substrate, the second substrate being shorter than the first substrate and exposing a portion of the plurality of electrodes on the first substrate;
a sealing material disposed between the first substrate and the second substrate to surround the organic light-emitting diode; and
an electrode protecting layer partially covering the exposed portion of the plurality of electrodes on the first substrate, a first surface of the electrode protecting layer being between the first substrate and the second substrate, and a second surface of the electrode protecting layer protruding beyond the second substrate,
wherein a height of the electrode protecting layer equals a distance between the first and second substrates,
wherein the plurality of electrodes extends from a same side of the organic light-emitting diode toward a same edge of the first substrate along the first direction, the plurality of electrodes being spaced apart from each other along a second direction perpendicular to the first direction,
wherein the electrode protecting layer extends along the second direction, the electrode protecting layer contacting the sealing material and being formed of a same material as the sealing material,
wherein the sealing material completely surrounds the organic light-emitting diode along four sides, the electrode protecting layer extending along and directly contacting an entire portion of the sealing material along one side of the four sides, and
wherein a length of the electrode protecting layer along the second direction equals a length of the portion of the sealing material along the one side.

2. The organic light-emitting display device as claimed in claim 1, wherein the sealing material and the electrode protecting layer include frit glass.

3. The organic light-emitting display device as claimed in claim 1, further comprising an outside sealing member around the sealing material, the outside sealing member being disposed between the first and second substrates and along an outermost edge of the second substrate.

4. The organic light-emitting display device as claimed in claim 3, further comprising a plurality of banks spaced apart from each other along an outer edge of the sealing material between the first substrate and the second substrate, the plurality of banks being configured to guide a flow of the outside sealing material before the outside sealing material is hardened.

5. The organic light-emitting display device as claimed in claim 4, wherein a height of the banks substantially equals a distance between the first substrate and the second substrate.

6. The organic light-emitting display device as claimed in claim 1, wherein the electrode protecting layer includes a plurality of discrete segments between the first substrate and the second substrate, each segment of the electrode protecting layer corresponding to a respective electrode of the plurality of electrodes.

7. The organic light-emitting display device as claimed in claim 6, wherein each segment of the electrode protecting layer extends to a predetermined distance along the first direction to partially cover the respective electrode.

8. The device as claimed in claim 6, further comprising:
a plurality of banks spaced apart from each other along an outer edge of the sealing material between the first substrate and the second substrate; and
an outside sealing material surrounding the sealing material, the outside sealing material filling spaces between the banks and between the segments of the electrode protecting layer.

9. The device as claimed in claim 8, wherein a height of the banks substantially equals a distance between the first substrate and the second substrate.

10. The organic light-emitting display device as claimed in claim 1, wherein a portion of the electrode protecting layer including the first surface of the electrode protecting layer overlaps portions of the first and second substrates along an edge of the second substrate.

11. The organic light-emitting display device as claimed in claim 1, wherein a first portion of a top surface of the electrode protecting layer directly contacts a bottom of the second substrate, and a second portion of the top surface of the electrode protecting layer is exposed, the first and second portions of the top surface of the electrode protecting layer facing a same direction and being coplanar.

12. The organic light-emitting display device as claimed in claim 1, wherein the electrode protecting layer is a continuous layer along a second direction perpendicular to the first direction.

13. The organic light-emitting display device as claimed in claim 1, wherein the electrode protecting layer continuously overlaps all the electrodes connected to the organic light-emitting diode.

14. A method of manufacturing an organic light-emitting display device, comprising:
forming a first substrate with an organic light-emitting diode and a plurality of electrodes connected to the organic light-emitting diode, the plurality of electrodes extending on the first substrate along a first direction toward an edge of the first substrate;
bonding the first substrate to a second substrate with a sealing material therebetween, the sealing material surrounding the organic light-emitting diode;
forming an electrode protecting layer between the first and second substrates to partially cover the electrodes on the first substrate, such that a height of the electrode protecting layer equals a distance between the first and second substrates; and
removing a portion of the second substrate, such that the second substrate is shorter than the first substrate and exposes a portion of the plurality of electrodes on the first substrate, and such that a first surface of the electrode protecting layer is between the first substrate and the second substrate and a second surface of the electrode protecting layer protrudes beyond the second substrate,
wherein the plurality of electrodes extends from a same side of the organic light-emitting diode toward a same edge of the first substrate along the first direction, the plurality of electrodes being spaced apart from each other along a second direction perpendicular to the first direction, and
wherein the electrode protecting layer extends along the second direction, the electrode protecting layer contacting the sealing material and being formed of a same material as the sealing material,
wherein the sealing material completely surrounds the organic light-emitting diode along four sides, the electrode protecting layer extending along and directly contacting an entire portion of the sealing material along one side of the four sides, and
wherein a length of the electrode protecting layer along the second direction equals a length of the portion of the sealing material along the one side.

15. The method as claimed in claim 14, wherein removing a portion of the second substrate includes cutting the second substrate along a scribe line, the scribe line overlapping the electrode protecting layer.

16. The method as claimed in claim 14, wherein, before bonding the first and second substrates, the sealing material and the electrode protecting layer are formed simultaneously of frit glass on the second substrate, the sealing material and the electrode protecting layer being continuous layers in direct contact with each other, the method further comprising forming an outside sealing material between the first substrate and the second substrate to surround the sealing material, after bonding the first substrate and the second substrate.

17. The method as claimed in claim 14, wherein forming the electrode protecting layer includes forming a plurality of discrete segments corresponding to respective electrodes of the plurality of electrodes, the discrete segments extending to a predetermined distance along the first direction, and the method further comprising:
forming a plurality of banks spaced apart from each other along an edge of the sealing material, the electrode protecting layer and the banks being formed simultaneously of a same material on the first substrate, and
forming an outside sealing material between the first substrate and the second substrate to fill spaces between adjacent banks and between adjacent segments of the electrode protecting layer.

* * * * *